(12) United States Patent
Nakamura

(10) Patent No.: US 12,028,037 B2
(45) Date of Patent: Jul. 2, 2024

(54) BANDPASS FILTER CIRCUIT, MODULE

(71) Applicant: Sanan Japan Technology Corporation, Tokyo (JP)

(72) Inventor: Hiroshi Nakamura, Tokyo (JP)

(73) Assignee: Sanan Japan Technology Corporation, Tokyo (JP)

( * ) Notice: Subject to any disclaimer, the term of this patent is extended or adjusted under 35 U.S.C. 154(b) by 283 days.

(21) Appl. No.: 17/663,712

(22) Filed: May 17, 2022

(65) Prior Publication Data

US 2022/0416748 A1    Dec. 29, 2022

(30) Foreign Application Priority Data

Jun. 28, 2021    (JP) ................... 2021-106727

(51) Int. Cl.
| | |
|---|---|
| *H03H 7/00* | (2006.01) |
| *H03H 7/01* | (2006.01) |
| *H03H 7/38* | (2006.01) |
| *H03H 9/54* | (2006.01) |

(52) U.S. Cl.
CPC ............ *H03H 7/0161* (2013.01); *H03H 7/38* (2013.01); *H03H 9/542* (2013.01)

(58) Field of Classification Search
CPC .......... H03H 7/0161; H03H 7/12; H03H 7/00; H03H 7/09; H03H 7/38; H03H 9/54; H03H 9/542; H03H 9/46
USPC .......................... 327/557, 551; 333/167, 172
See application file for complete search history.

(56) References Cited

U.S. PATENT DOCUMENTS

| | | | | |
|---|---|---|---|---|
| 11,476,822 | B2 * | 10/2022 | Sawaguchi | .......... H03H 7/0115 |
| 11,664,778 | B2 * | 5/2023 | Sawaguchi | .......... H03H 7/0161 |
| | | | | 333/167 |

* cited by examiner

*Primary Examiner* — Hai L Nguyen
(74) *Attorney, Agent, or Firm* — Dorsey & Whitney LLP

(57) ABSTRACT

A bandpass filter circuit includes a fourth element that is a capacitor having one end connected to a first node, a fifth element that is a capacitor having one end connected to a second node, a sixth element that is a capacitor connected between other end of the fourth element and other end of the fifth element, a seventh element that is an inductor having one end connected to a fourth node to which the fourth element and the sixth element are connected, other end of the seventh element is connected to a ground terminal, and an eighth element that is an inductor having one end connected to a fifth node to which the fifth element and the sixth element are connected, other end of the eighth element is connected to the ground terminal.

14 Claims, 11 Drawing Sheets

BANDPASS FILTER CIRCUIT, MODULE

CROSS REFERENCE TO RELATED APPLICATION(S)

The present disclosure claims priority to Japanese Patent Application No. 2021-106727 filed Jun. 28, 2021, the disclosure of which is expressly incorporated herein by reference in its entirety for any purpose.

FIELD

The present disclosure relates to a bandpass filter circuit and a module.

BACKGROUND ART

JP2018-129680A (Patent Document 1) discloses a filter circuit for increasing the steepness of the cut-off characteristics, a multiplexer, and a module. In FIG. 6 of the Patent Document 1, it is illustrated that an LC series resonant circuit is provided between a node N1 (between a terminal T1 and elastic wave resonators R1$a$, R1$b$) and a node N2 (between a terminal T2 and the elastic wave resonators R1$a$, R1$b$). This LC series resonant circuit is one in which an inductor and two capacitors are connected in series.

In the bandpass filter, it is required to increase the steepness of the cutoff characteristics between a passband and a stopband. It is required that the high-pass side of the passband of the bandpass filter circuit is steep. Further, it is required to realize a broadband blocking characteristic on the high-pass side. It has also been required to realize such a bandpass filter circuit with a simple configuration using a small number of elements.

SUMMARY

The present disclosure has been made to solve the above-described problems. An object of the present disclosure is to provide a bandpass filter circuit and a module with a steep cutoff characteristic at the upper cutoff frequency as well as a broad stop band while having a simple configuration using fewer elements.

In some examples, a bandpass filter circuit includes an elastic wave resonator connected in series between an input terminal and an output terminal, a first element that is a capacitor having one end connected to a first node between the input terminal and the elastic wave resonator, a second element that is a capacitor having one end connected to a second node between the elastic wave resonator and the output terminal, a third element that is an inductor having one end connected to a third node where other end of the first element and other end of the second element are connected, and other end of the third element is connected to a ground terminal, a fourth element that is a capacitor having one end connected to the first node, a fifth element that is a capacitor having one end connected to the second node, a sixth element that is a capacitor connected between other end of the fourth element and other end of the fifth element, a seventh element that is an inductor having one end connected to a fourth node to which the fourth element and the sixth element are connected, other end of the seventh element is connected to the ground terminal, and an eighth element that is an inductor having one end connected to a fifth node to which the fifth element and the sixth element are connected, other end of the eighth element is connected to the ground terminal.

In some examples, the bandpass filter circuit includes a ninth element that is a capacitor provided in parallel with the third element between the third node and the ground terminal.

In some examples, an anti-resonant frequency of the elastic wave resonator is higher than a passband upper end of the bandpass filter circuit.

In some examples, the bandpass filter circuit includes at least one matching circuit provided between the input terminal and the first node and/or between the output terminal and the second node.

In some examples, the bandpass filter circuit includes at least one inductor provided between the first node and the ground terminal, and/or between the second node and the ground terminal.

In some examples, the elastic wave resonator includes an Interdigital Transducer.

In some examples, the elastic wave resonator includes a piezoelectric thin film resonator.

In some examples, a module includes the bandpass filter circuit.

DETAILED DESCRIPTION

Figure 1:
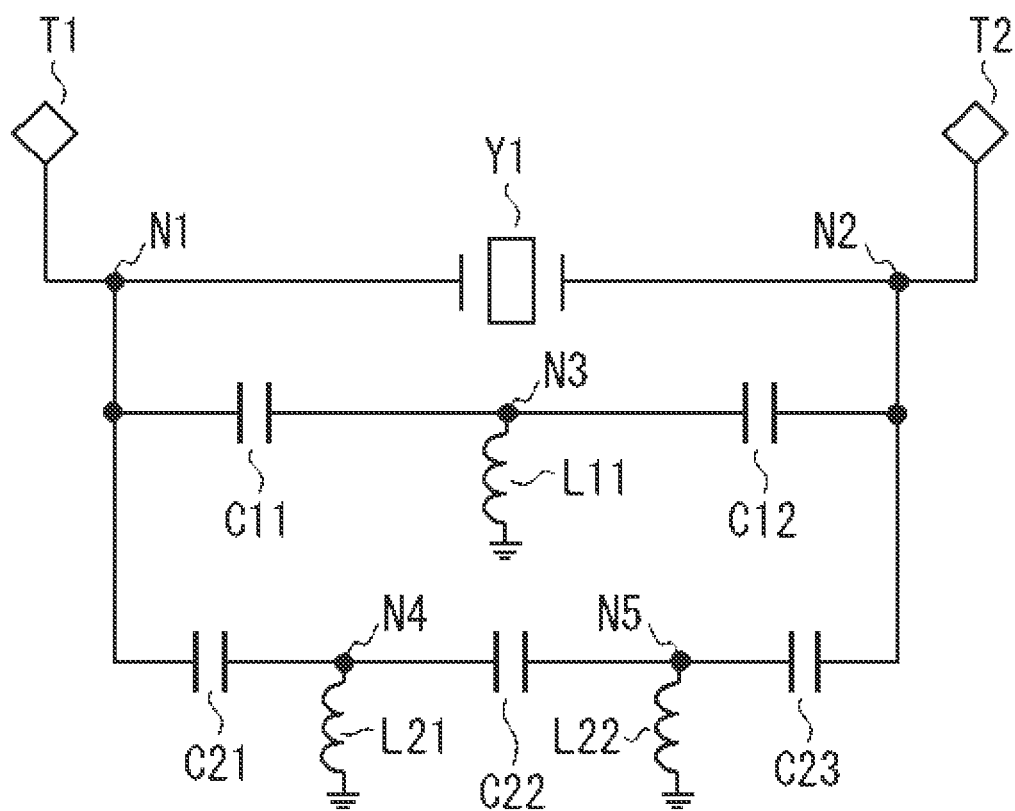
FIG. 1 is a circuit diagram of a bandpass filter circuit in the first embodiment.

Embodiments will be described with reference to the accompanying drawings. In the drawings, the same or corresponding parts are denoted by the same reference numerals. Duplicate descriptions of such portions may be simplified or omitted.

Embodiment 1

Figure 2:
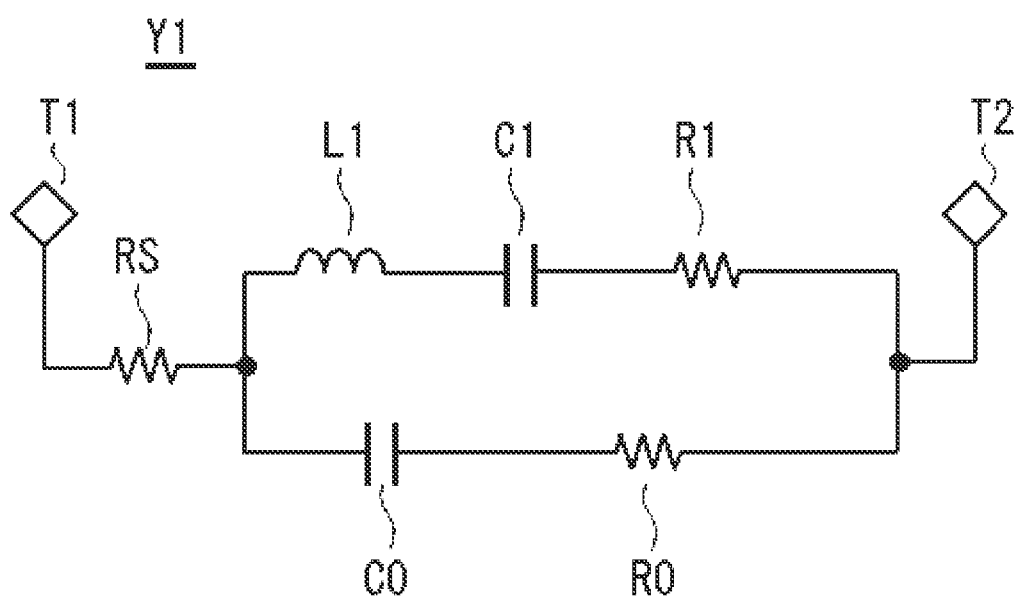
FIG. 2 is an equivalent circuit diagram showing a configuration example of an elastic wave resonator.
Figure 3A:
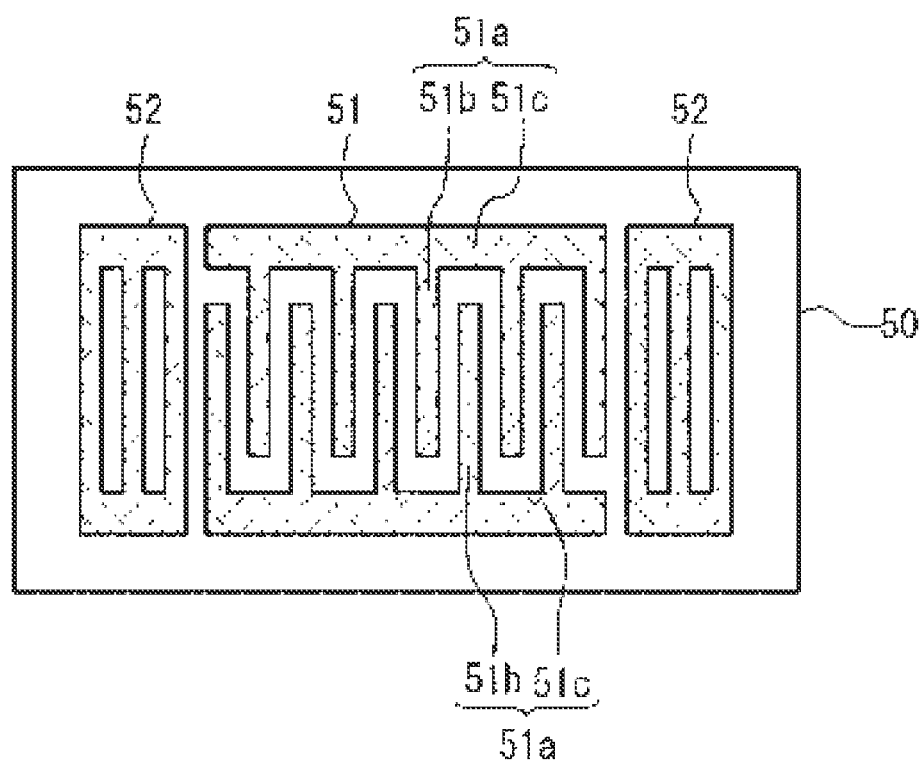
FIG. 3A is a diagram showing a structural example of an elastic wave resonator.
Figure 3B:
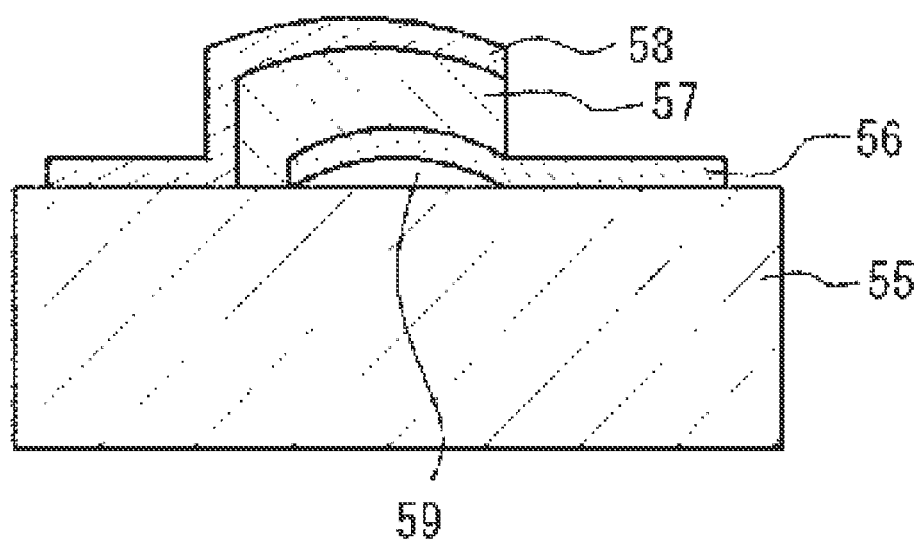
FIG. 3B is a diagram showing another structural example of an elastic wave resonator.

FIG. 1 is a circuit diagram of a bandpass filter circuit in the embodiment 1. The bandpass filter circuit includes an input terminal T1 and an output terminal T2. An elastic wave resonator Y1 is connected in series between the input terminal T1 and the output terminal T2. In FIGS. 2, 3A, 3B, examples of the elastic wave resonator Y1 are illustrated.

FIG. 2 is a diagram showing an equivalent circuit of the elastic wave resonator Y1. The elastic wave resonator has a resistor RS connected to the input terminal T1. A series circuit having an inductor L1, a capacitor C1 and a resistor R1, and a series circuit having a capacitor C0 and a resistor R0 are connected in parallel between the resistor RS and the output terminal 12.

FIG. 3A is a diagram showing another configuration example of an elastic wave resonator Y1. FIG. 3A is a plan view of a surface acoustic wave resonator. The surface acoustic wave resonator includes an Interdigital Transducer (IDT) 51 and a reflectors 52 on a piezoelectric substrate 50. The IDT 51 has a pair of comb-shaped electrodes 51a which are oppositely disposed. According to one example, the comb-shaped electrode 51a includes a plurality of electrode fingers 51b, and a bus bar 51c for connecting the plurality of electrode fingers 51b. The reflectors 52 are provided on both sides of the IDT SI so as to sandwich the IDT51. The IDT 51 excites the surface acoustic wave to the piezoelectric substrate 50. The piezoelectric substrate 50 is, by way of example, a lithium tantalate substrate or a lithium niobate substrate. According to one example, the IDT 51 and the reflector 52 are formed of an aluminum film or a copper film. According to one example, the piezoelectric substrate 50 may be bonded to the lower surface of a support substrate such as a sapphire substrate, an alumina substrate, a spinel substrate or a silicon substrate. Note that a protective film or a temperature compensation film covering the IDT 50 and the reflector 52 may be provided.

FIG. 3B shows another exemplary elastic wave resonator Y1. FIG. 3B is a cross-sectional view of a piezoelectric thin film resonator. The piezoelectric thin film resonator is provided with a piezoelectric film 57 on a substrate 55. A lower electrode 56 and an upper electrode 58 are provided to sandwich the piezoelectric film 57. A gap 59 is formed between the lower electrode 56 and the substrate 55. Then, the lower electrode 56 and the upper electrode 58 excite the elastic wave of the thickness longitudinal vibration mode in the piezoelectric film 57. According to one example, the lower electrode 56 and the upper electrode 58 are metal films such as ruthenium films. According to one example, the piezoelectric film 57 is an aluminum nitride film. According to one example, the substrate 55 is a silicon substrate, a sapphire substrate, an alumina substrate, a spinel substrate or a glass substrate. According to another example, an elastic wave resonator Y1 having a configuration that differs from the configuration shown in FIGS. 2, 3A, 3B may be employed.

As shown in FIG. 1, the band-pass filter circuit includes a first element C11 having one end connected to a first node N1 between the input terminal T1 and the elastic wave resonator Y1 The first element C11 is a capacitor. There is a second node N2 between the elastic wave resonator Y1 and the output terminal T2. One end of a second element C12 is connected to the second node N2. The second element C12 is a capacitor.

The position where other end of the first element C11 and other end of the second element C12 are connected is a third node N3. The third node N3 is connected to one end of a third element L11. Other end of the third element L11 is connected to a ground terminal. The third element L11 is an inductor. One end of a fourth element C21 is connected to the first node N1. The fourth element C21 is a capacitor. One end of a fifth element C23 is connected to the second node N2. The fifth element C23 is a capacitor.

A sixth element C22 is connected to other end of the fourth element C21 and other end of the fifth element C23. The sixth element C22 is a capacitor. The position where the fourth element C21 and the sixth element C22 are connected is a fourth node N4. The fourth node N4 is connected to one end of a seventh element L21. Other end of the seventh element L21 is connected to the ground terminal. The seventh element L21 is an inductor. The position where the fifth element C23 and the sixth element C22 are connected is a fifth node N5. The fifth node N5 is connected to one end of an eighth element L22. Other end of the eighth element L22 is connected to the ground terminal. The eighth element L22 is an inductor.

Figure 4:
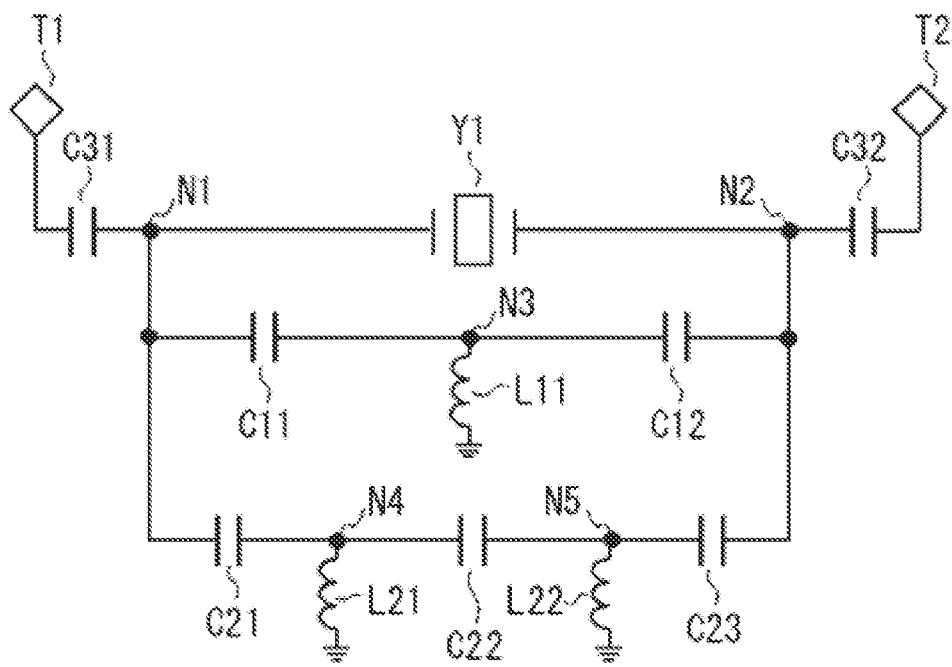
FIG. 4 is a circuit diagram of a bandpass filter circuit obtained by adding a matching circuit.

FIG. 4 is a circuit diagram of a bandpass filter circuit according to another example. This bandpass filter circuit is different from the bandpass filter circuit of FIG. 1 in that it has matching circuits C31. C32. The matching circuit C31 is provided between the input terminal T1 and the first node N1 The matching circuit C32 is provided between the output terminal T2 and the second node N2. According to another example, it is possible to provide only one of the matching circuits C31, C32.

FIGS. 5-8 are diagrams showing a frequency characteristic of S parameter in the bandpass filter circuit of FIG. 4. These frequency characteristics were obtained under the following simulation conditions.

Input terminal T1, Output terminal: 50Ω termination
Elastic wave resonator Y1 (FIG. 2): Resonant frequency fr=5.003 GHz
Elastic wave resonator Y1 (FIG. 2): Q value at resonant frequency (Qr)=500
Elastic wave resonator Y1 (FIG. 2): anti-resonance frequency fa=5.176 GHz
Elastic wave resonator Y1 (FIG. 2): Q value at anti-resonance frequency (Qa)=500
Capacitance of the capacitor C0: 0.194 pF Characteristics of each element were optimized for n79, one of the new radio frequency bands for fifth-generation mobile communication system 5G, using numerical optimization methods with design-tools including Agilent's Advanced Design System (ADS). Incidentally, the passband of the n79 is 4.4-5.0 GHz.

Figure 5:
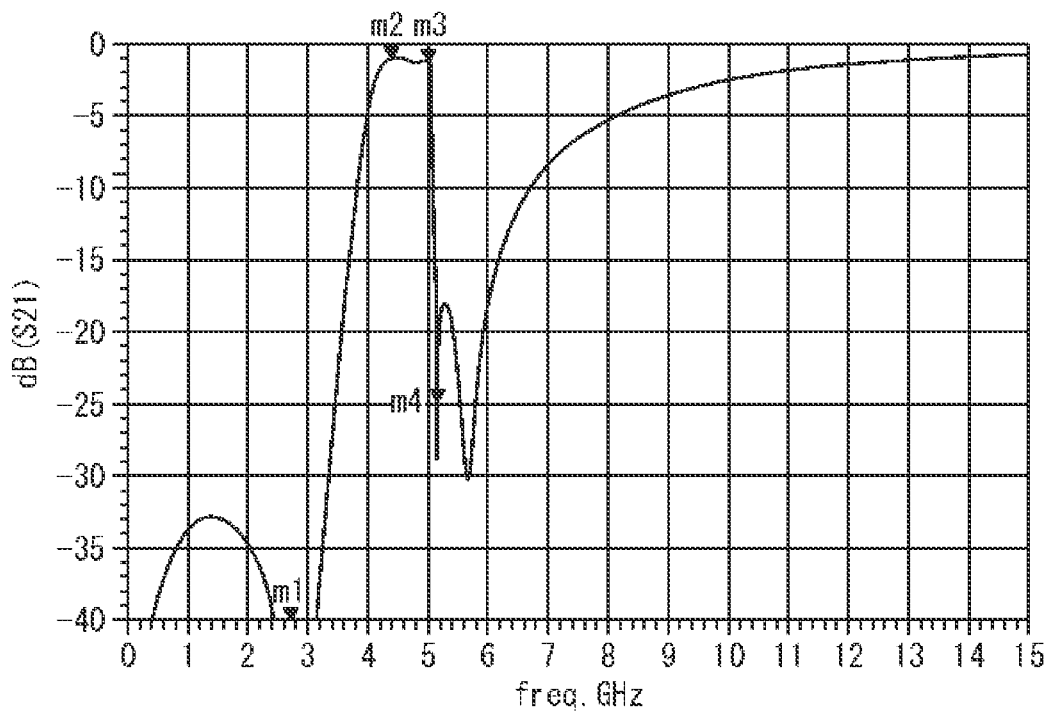
FIG. 5 is a diagram showing a frequency characteristic of S21.

FIG. 5 is a diagram showing the frequency dependence of the passing characteristic (S21) from the input terminal T1 to the output terminal T2. Attenuation is required at frequencies below the frequency indicated by the m1 marker. In this example, the frequency of the m1 was 2.69 GHz (2.7 GHz for convenience). The m2 and m3 markers indicate the frequencies at the bottom and top of the passband, respectively. The frequency of m2 is, for example, 4.4 GHz. The frequency of m3 is, for example, 5.0 GHz. Attenuation is required at frequencies above the frequency indicated by the m4 marker. In this example, the frequency of m4 is 5.15 GHz.

The values of S21 in m1, m2, m3, and m4 were as follows.

S21 in m1=−45.049
S21 in m2=−1.220
S21 in m3=−1.121
S21 in m4=−24.015

Figure 6:
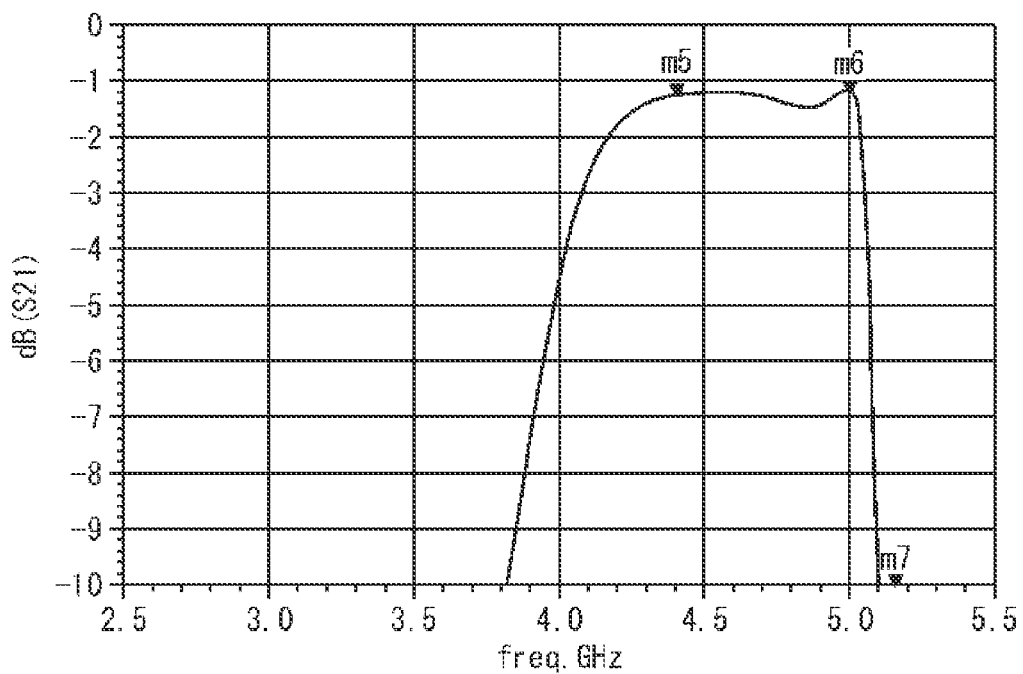
FIG. 6 is a partially enlarged view of FIG. 5.

FIG. 6 is an enlarged view of the passband in FIG. 5. The frequencies m5, m6, and m7 are the same as the frequencies m2, m3, and m4 described above. From FIGS. 5,6, it can be seen that the passband having a small loss (i.e. large S21) is relatively wide band. Moreover, in the higher frequency side than m3, it is possible to steepen the cutoff characteristic between the passband and the stopband. Furthermore, such excellent effects can be realized in a simple circuit with one elastic wave resonator, three inductor elements and a small number of capacitors, as shown in FIG. 4.

Figure 7:
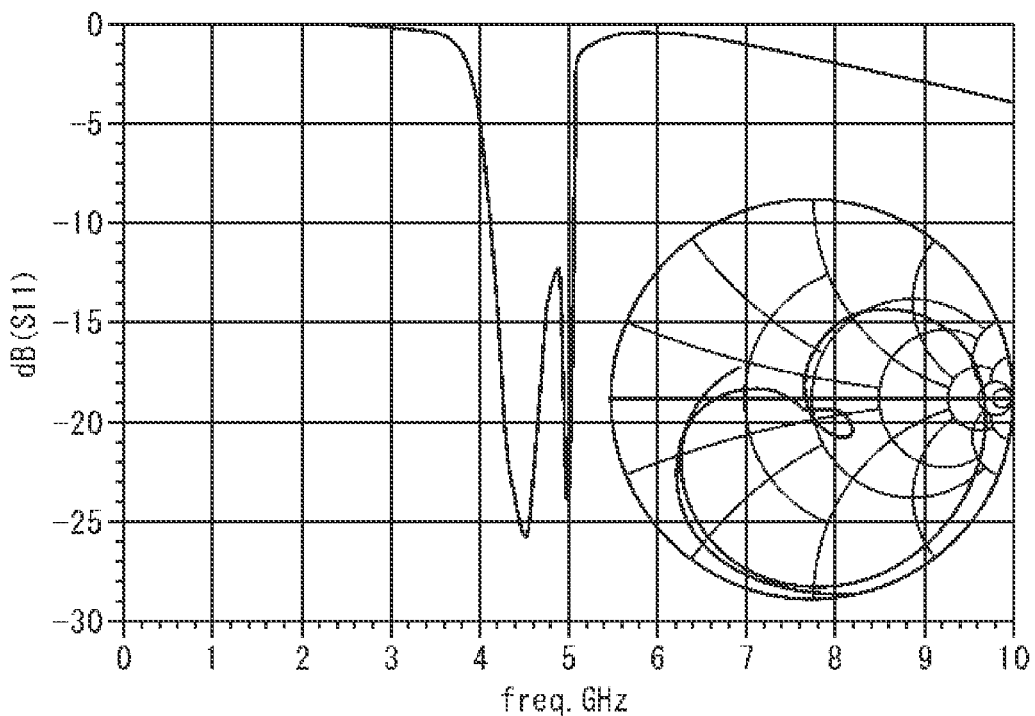
FIG. 7 is a diagram showing a frequency characteristic of S11.

FIG. 7 is a diagram showing the frequency dependence of the input reflection coefficient (S11). The S11 shows the ratio of the signal reflected to the input terminal T1 with respect to the signal input to the input terminal T1. FIG. 7 also shows a Smith chart showing reflection characteristics.

Figure 8:
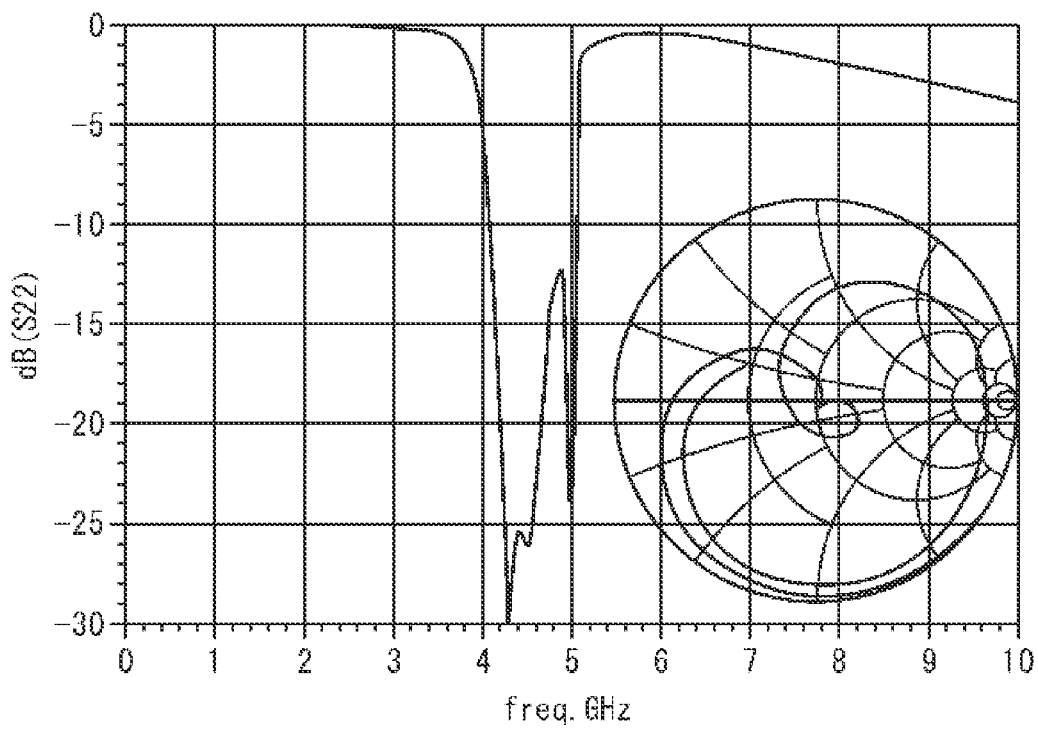
FIG. 8 is a diagram showing a frequency characteristic of S22.

FIG. 8 is a diagram showing the frequency dependence of the output reflection coefficient (S22). The S22 shows the ratio of the signal reflected to the output terminal T2 with respect to the signal input from the output terminal T2. FIG. 8 also shows a Smith chart showing reflection characteristics.

At frequencies m2, m3, i.e., 4.4 GHz, 5.0 GHz, S21 is large and the reflection coefficient is small. Therefore, the high-frequency signal input from the input terminal T1 is hardly reflected and attenuated in the band-pass filter circuit, and outputs from the output terminal T2. On the other hand, at frequencies m1, m4, i.e., 2.7 GHz, 5.15 GHz, S21 is small and the reflection coefficient is large. Therefore, the high-frequency signal input from the input terminal T1 is almost reflected or attenuated in the band-pass filter circuit. As a result, almost no output is output from the output terminal T2. Furthermore, the difference between m3 and m4 is small. At the high-pass side of the passband, the cutoff characteristic between the passband and the stopband is steep.

Figure 9:
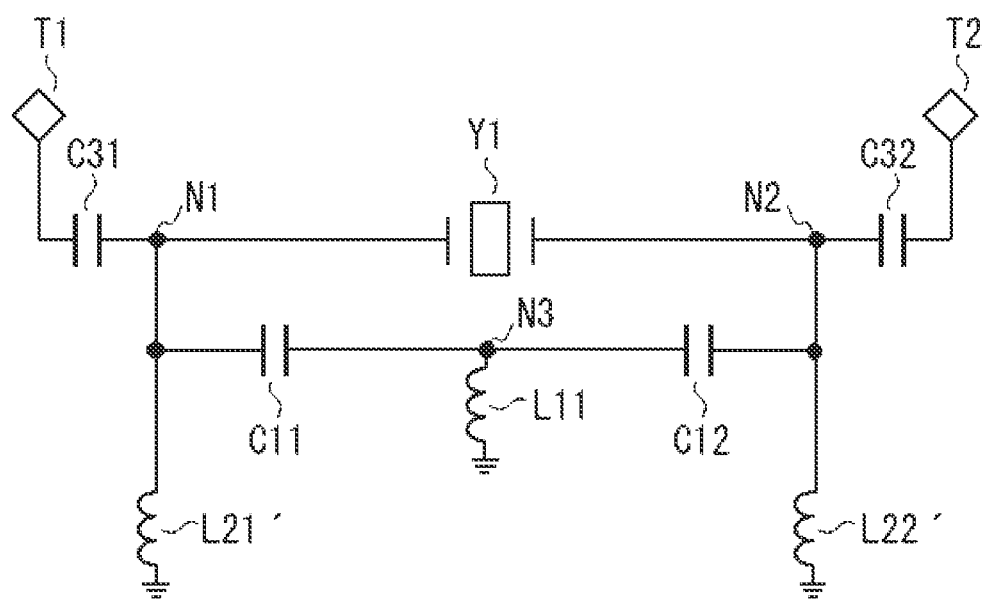
FIG. 9 is a circuit diagram of a bandpass filter circuit according to a comparative example.

Now, a comparative example will be described with reference to FIGS. 9 and 10. FIG. 9 is a circuit diagram of a bandpass filter circuit according to a comparative example. The band-pass filter circuit has an inductor L21'. One end of the inductor L21' is connected to the first node N1, and the other end is connected to the ground terminal. Furthermore, the band-pass filter circuit has an inductor L22'. One end of the inductor L22' is connected to the second node N2, and the other end is connected to the ground terminal.

Figure 10:
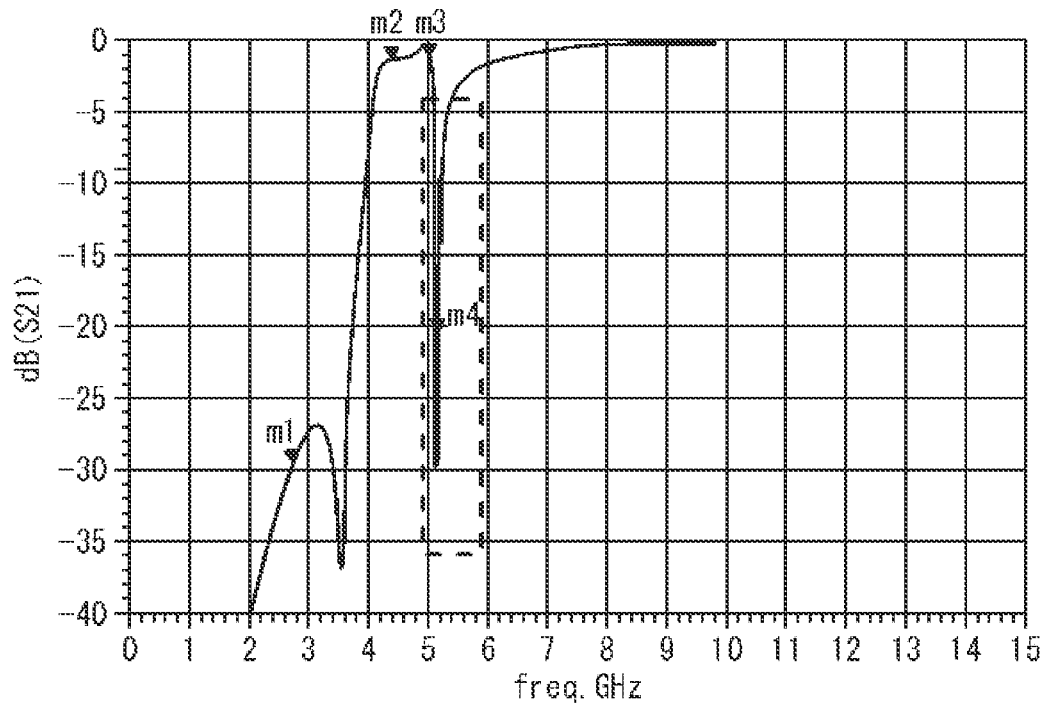
FIG. 10 is a diagram showing a frequency characteristic of S21 in the comparative example.

FIG. 10 is a diagram showing the frequency characteristic of S21 of the bandpass filter circuit according to the comparative example. The graph of FIG. 10 was obtained under the following simulation conditions.

Input terminal T1, Output terminal: 50Ω termination
Elastic wave resonator Y1 (FIG. 2): Resonant frequency fr=5.119 GHz
Elastic wave resonator Y1 (FIG. 2): Q value at resonant frequency (Qr)=500
Elastic wave resonator Y1 (FIG. 2): anti-resonance frequency fa=5.296 GHz
Elastic wave resonator Y1 (FIG. 2): Q value at anti-resonance frequency (Qa)=500
Capacitance of capacitor C0: 0.159 pF The characteristics of each element were optimized for n79 using a numerical optimization method with a design tool including ADS of Agilent.

The same frequencies as the frequencies m1, m2, m3, m4 illustrated in FIG. 5 are also illustrated in FIG. 10. The values of S21 of m1, m2, m3, and m4 in FIG. 10 were as follows. Incidentally, the values of S21 of m1-m4 in FIG. 5 are quoted in parentheses.

m1:S21=−29.723(45.049)
m2:S21=−1.377(−1.220)
m3:S21=0.915(−1.121)
m4:S21=−20.093(−24.015)

In the frequency characteristic of FIG. 10, it is not possible to steepen the cutoff characteristic between the passband and the stopband in the high-pass side from m3. That is, although the band where S21 becomes lower at a frequency higher than the passband upper end should be ensured wide. S21 in the region surrounded by the broken line in FIG. 10 is not sufficiently low.

Filter characteristics obtained by the circuit configuration of the first embodiment described above becomes steep at the high-pass side of the passband. Furthermore, a broad stop band is provided at the high-pass side. Therefore, the filter characteristics obtained by the circuit configuration of the first embodiment is far more excellent compared to the comparative example.

Embodiment 2

Figure 11:
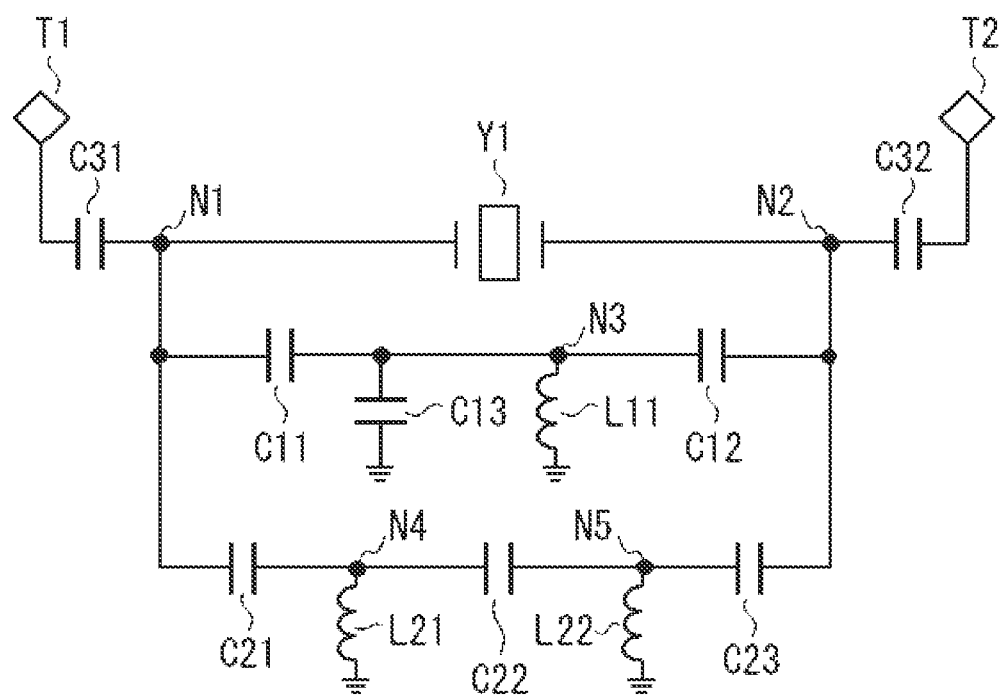
FIG. 11 is a circuit diagram of a bandpass filter circuit in the second embodiment.

FIG. 11 is a circuit diagram of a bandpass filter circuit according to Embodiment 2. The band-pass filter circuit differs from the configuration of FIG. 4 in that it includes a ninth element C13. The ninth element C13 is provided between the third node N3 and the ground terminal. The ninth element C13 is a capacitor provided in parallel with the third element L11.

FIGS. 12-15 are diagrams showing a frequency characteristic of the S parameter in the bandpass filter circuit of FIG. 11. These frequency characteristics were obtained under the following simulation conditions.

Input terminal T1, Output terminal: 50Ω termination
Elastic wave resonator Y1 (FIG. 2): resonant frequency fr=4.967 GHz
Elastic wave resonator Y1 (FIG. 2): Q value at resonant frequency (Qr)=500
Elastic wave resonator Y1 (FIG. 2): anti-resonance frequency fa=5.139 GHz
Elastic wave resonator Y1 (FIG. 2): Q value at anti-resonance frequency (Qa)=500
Capacitance of capacitor C0: 0.286 pF The characteristics of each element were optimized for n79 using a numerical optimization method with a design tool including ADS of Agilent.

Figure 12:
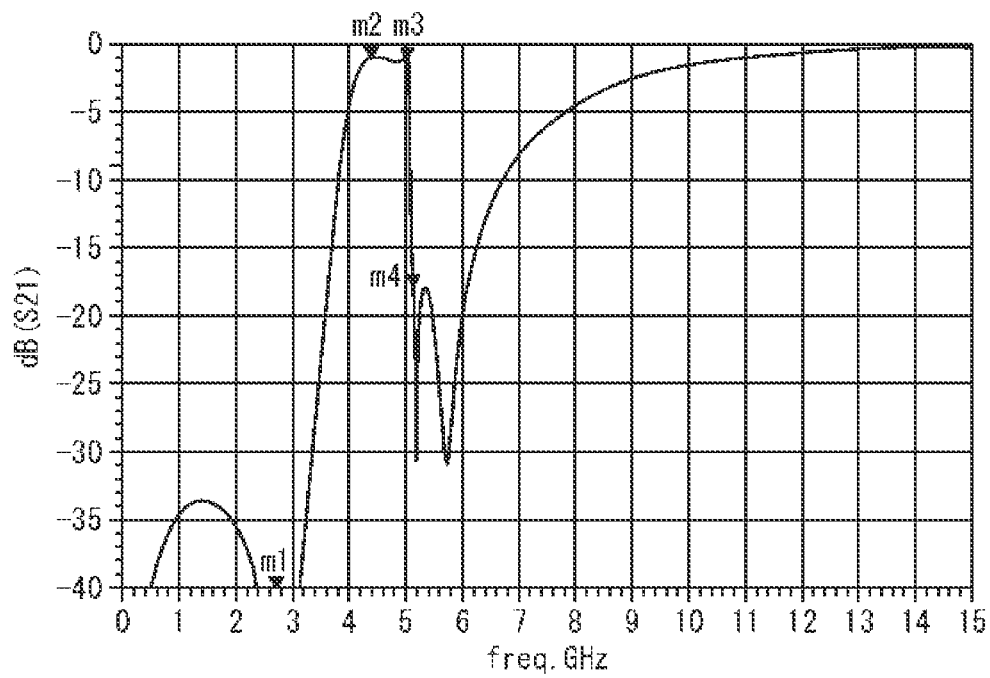
FIG. 12 is a diagram showing a frequency characteristic of S21.

The frequencies m1, m2, m3, and m4 in FIG. 12 are the same as m1, m2, m3, and m4 in FIG. 5. The values of S21 of m1, m2, m3, and m4 in FIG. 12 were as follows. Note that the values of S21 of m1, m2, m3, and m4 in FIG. 5 are quoted in parentheses m1:S21=−46.510(45.049)
m2:S21=−1.215(−1.220)
m3:S21=−1.230(−1.121)
m4:S21=−17.550(−24.015)

Figure 13:
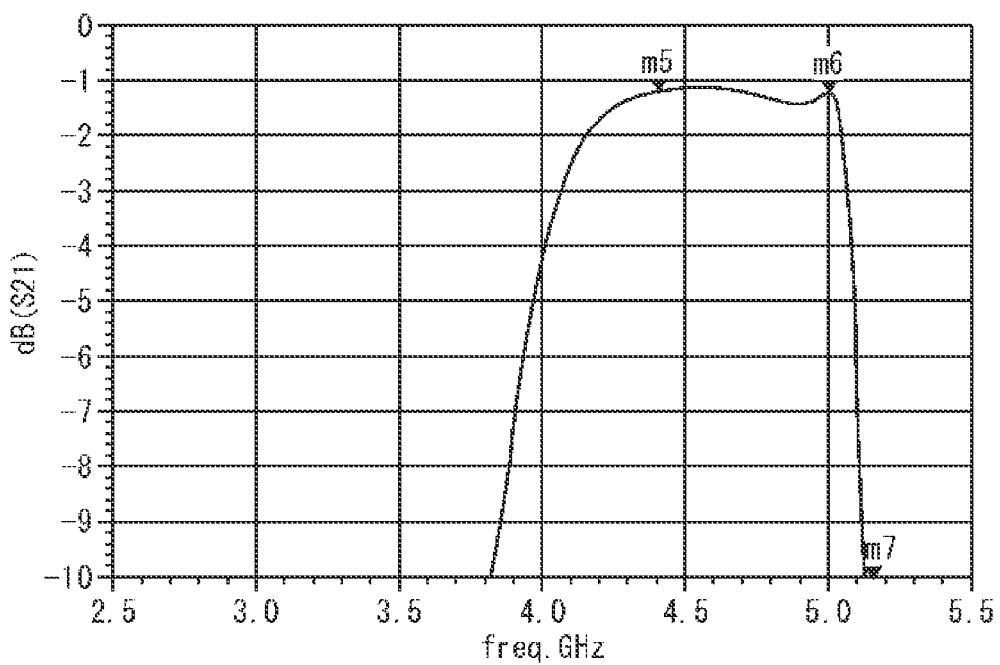
FIG. 13 is a partially enlarged view of FIG. 12.

FIG. 13 is an enlarged view of the passband in FIG. 12. The frequencies m5, m6, and m7 are the same as the frequencies m2, m3, and m4 described above. From FIGS. 12 and 13, it can be seen that the passband having a small loss (i.e. large S21 value) is relatively wide. Moreover, in the high-frequency side from m3, it is possible to steepen the cutoff characteristic between the passband and the stopband. Further, such an excellent effect can be realized with a small number of parts.

Figure 14:
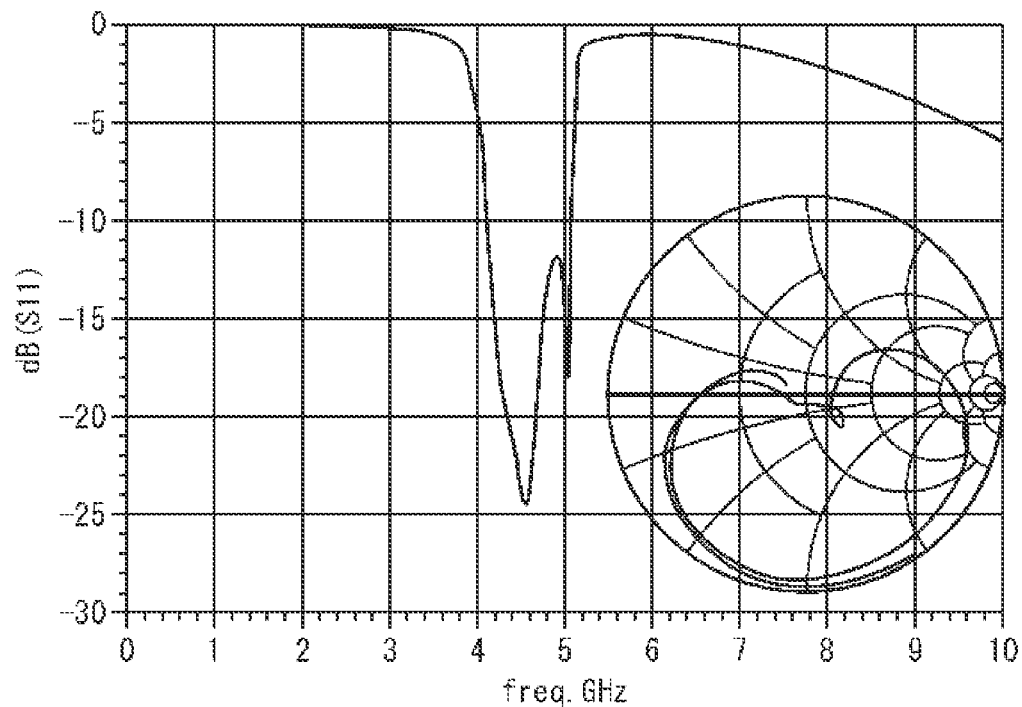
FIG. 14 is a diagram showing a frequency characteristic of S11.
Figure 15:
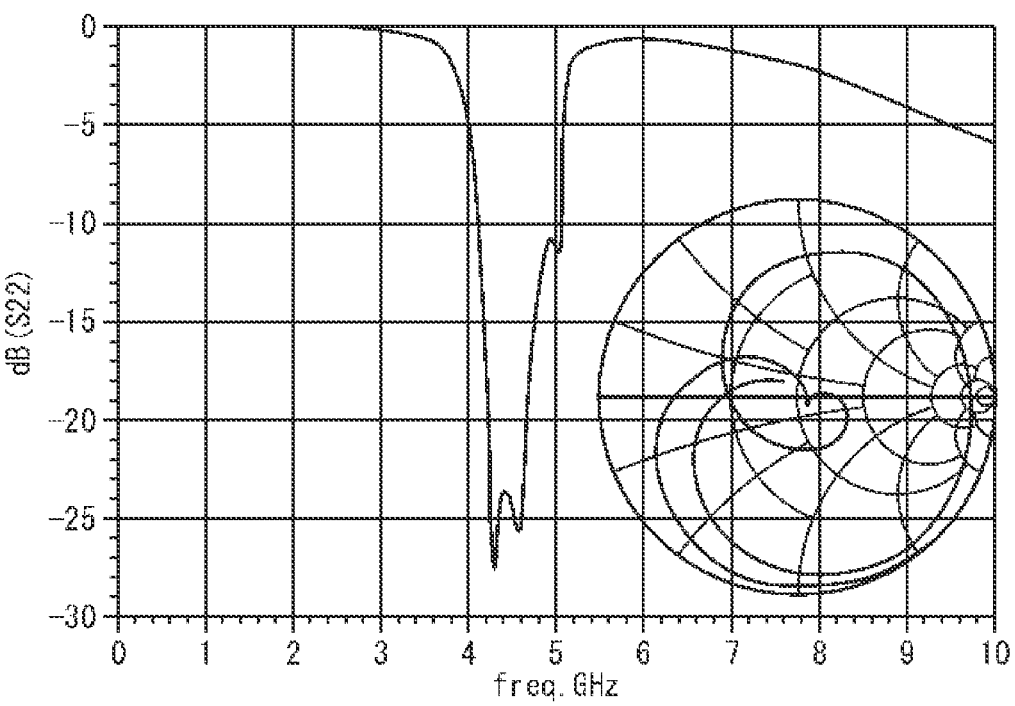
FIG. 15 is a diagram showing a frequency characteristic of S22.

FIG. 14 is a diagram showing the frequency dependence of S11. FIG. 14 also shows a Smith chart showing reflection characteristics. FIG. 15 is a diagram showing the frequency dependence of S22. FIG. 15 also shows a Smith chart showing reflection characteristics.

From these simulation results, the band-pass filter circuit according to the second embodiment shown in FIG. 11 has same characteristics as the band-pass filter circuit according to the first embodiment shown in FIG. 4.

According to the configuration according to the second embodiment, by adding the ninth element C13, it is possible to increase the capacitance value of the capacitor C0 of the elastic wave resonator Y1. According to one example, the capacitance value of the capacitor C0 in the bandpass filter circuit of FIG. 4 is 0.194 pF. However, in the bandpass filter circuit of FIG. 11, the capacitance value of the capacitor C0 can be as large as 0.286 pF. Increasing the capacitance value of the capacitor C0 increases the power resistance.

Embodiment 3

Figure 16:
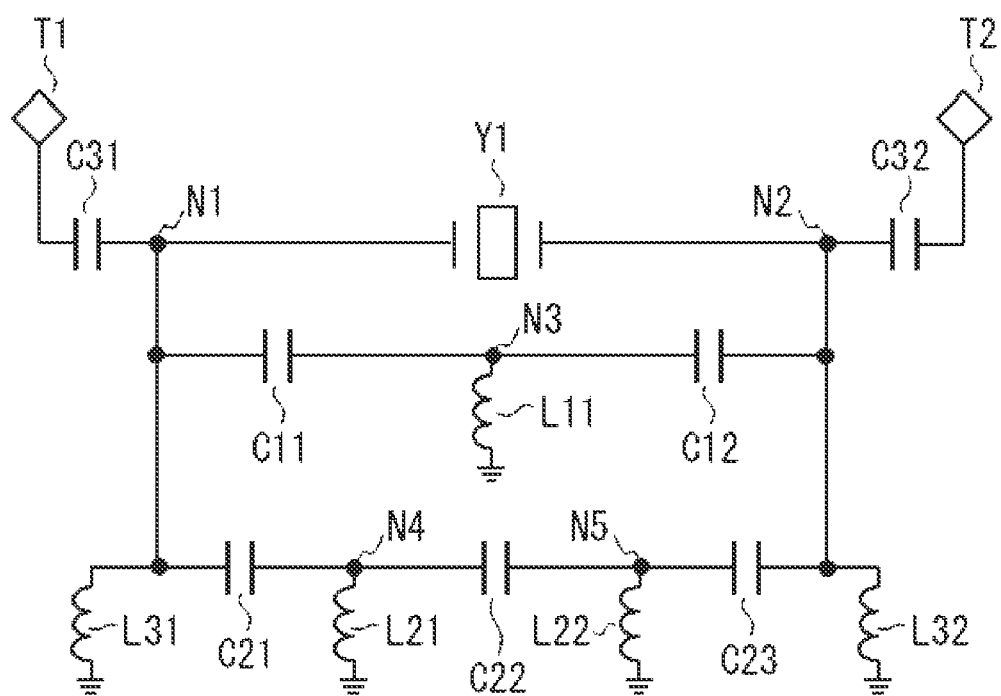
FIG. 16 is a circuit diagram of a bandpass filter circuit in third embodiment.

FIG. 16 is a diagram showing a circuit diagram of a band-pass filter circuit according to the third embodiment. The band-pass filter circuit differs from the band-pass filter circuit of FIG. 4 in that it includes an inductors L31, L32. The Inductor L31 connects the first node N1 to the ground terminal. The Inductor L32 connects the second node N2 to the ground terminal. According to another example, it is possible to comprise only one of the inductor L31 and the inductor L32. With this circuit configuration, similarly to the first and second embodiments, it is possible to improve the steepness of the cutoff characteristic between the passband and the stopband in the high-pass side of the passband while providing a broadband stop characteristic in the high-pass side.

Embodiment 4

FIGS. 17A, 17B, 17C, 17D show cross-sectional views of modules according to Embodiment 4 These modules are provided with the bandpass filter circuit of Embodiment 1, bandpass filter circuit of Embodiment 2, or bandpass filter circuit of Embodiment 3.

Figure 17A:
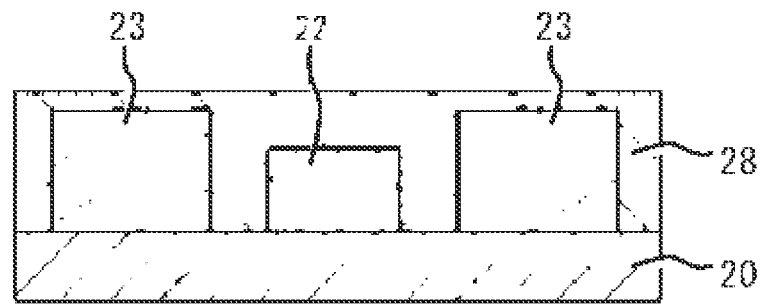
FIG. 17A is a cross-sectional view of a module.

The module shown in FIG. 17A comprises an elastic wave resonator 22 and an integrated passive device (IPD) 23 mounted on a printed circuit board 20. In the IPD 23, circuits other than the elastic wave resonator among the band-pass filter circuit described above are integrated. A resin sealing portion 28, for example, is provided on the printed circuit board 20. The resin sealing portion 28 covers the elastic wave resonator 22 and IPD23. According to one example, the printed circuit board 20 is a substrate on which wiring is formed on an insulating substrate made of glass epoxy resin or the like. The resin sealing portion 28 is, for example, a mold resin such as an epoxy resin. The module shown in FIG. 17B comprises an elastic wave resonator 22 and a chip component 26 mounted on a printed circuit board 20. The chip component 26 is an inductor or a capacitor.

Figure 17B:
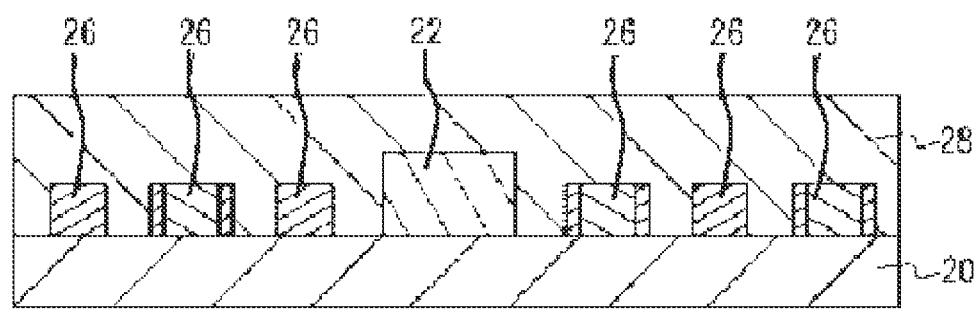
FIG. 17B is a cross-sectional view of a module according to another example.
Figure 17C:
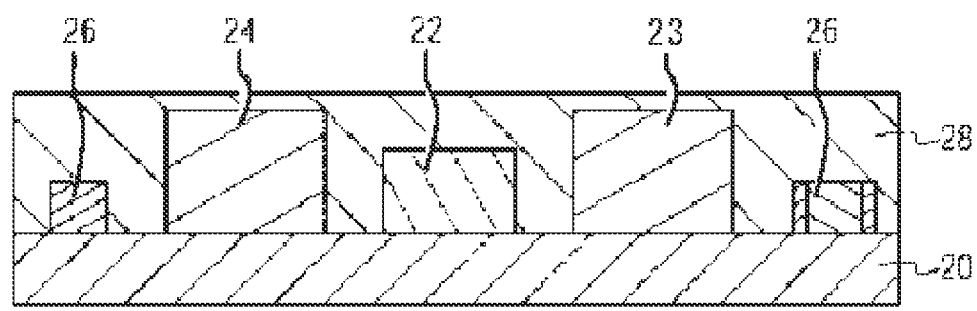
FIG. 17C is a cross-sectional view of a module according to another example.

The module shown in FIG. 17C comprises an elastic wave resonator 22, IPD23, multilayer filter 24 and chip components 26 mounted on a printed circuit board 20. In the IPD23 or the chip component 26, the components of the band-pass filter circuit described above is provided. The multilayer filter 24 may be provided with at least some filters of a diplexer and a duplexer. The chip component 26 may be provided with at least a portion of a capacitor and an inductor of the diplexer.

Figure 17D:
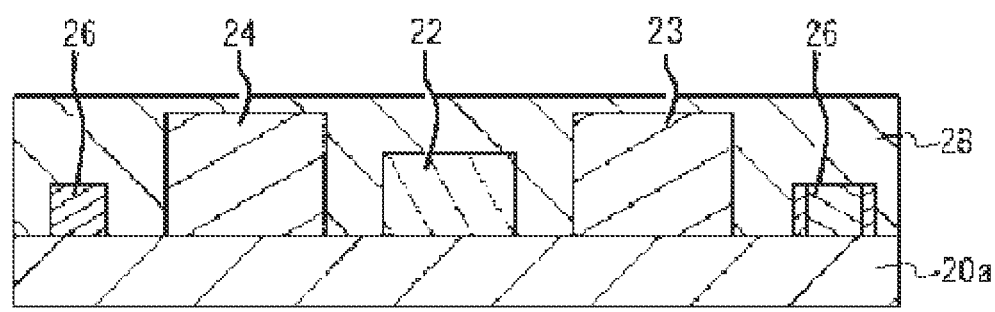
FIG. 17D is a cross-sectional view of a module according to another example.

Instead of the printed circuit boards 20 of FIGS. 17A, 17B, 17C, it may be used a ceramic substrate 20a shown in FIG. 17D. The ceramic substrate 20a is, for example, LTCC (Low Temperature Co-fired Ceramic) or HTCC (High Temperature Co-fired Ceramic).

While several aspects of at least one embodiment have been described, it is to be understood that various modifications and improvements will readily occur to those skilled in the art. Such modifications and improvements are intended to be part of the present disclosure and are intended to be within the scope of the present disclosure.

It is to be understood that the embodiments of the methods and apparatus described herein are not limited in application to the structural and ordering details of the components set forth in the foregoing description or illustrated in the accompanying drawings. Methods and apparatus may be implemented in other embodiments or implemented in various manners.

Specific implementations are given here for illustrative purposes only and are not intended to be limiting. For example, although the embodiment illustrates a circuit in which one elastic wave resonator Y1 is connected between the first node N1 and the second node N2, a circuit in which a plurality of equivalent elastic wave resonators are connected between the first node N1 and the second node N2 in a parallel, series, or both connection method is also included. Further, the number of components mounted on the module is not limited to the number shown in the drawing.

The phraseology and terminology used in the present disclosure are for the purpose of description and should not be regarded as limiting. The use of "including." "comprising," "having," and variations thereof herein means the inclusion of the items listed hereinafter and equivalents thereof, as well as additional items.

The reference to "or" may be construed so that any term described using "or" may be indicative of one, more than one, and all of the terms of that description.

References to front, back, left, right, top, bottom, and side are intended for convenience of description. Such references are not intended to limit the components of the present disclosure to any one positional or spatial orientation. Accordingly, the foregoing description and drawings are by way of example only.

The invention claimed is:

1. A bandpass filter circuit, comprising:
an elastic wave resonator connected in series between an input terminal and an output terminal;
a first element that is a capacitor having one end connected to a first node between the input terminal and the elastic wave resonator;
a second element that is a capacitor having one end connected to a second node between the elastic wave resonator and the output terminal;
a third element that is an inductor having one end connected to a third node where other end of the first element and other end of the second element are connected, other end of the third element is connected to a ground terminal;
a fourth element that is a capacitor having one end connected to the first node;
a fifth element that is a capacitor having one end connected to the second node;
a sixth element that is a capacitor connected between other end of the fourth element and other end of the fifth element;
a seventh element that is an inductor having one end connected to a fourth node to which the fourth element and the sixth element are connected, other end of the seventh element is connected to the ground terminal; and an eighth element that is an inductor having one end connected to a fifth node to which the fifth element and the sixth element are connected, other end of the eighth element is connected to the ground terminal.

2. The bandpass filter circuit according to claim 1, comprising a ninth element that is a capacitor provided in parallel with the third element between the third node and the ground terminal.

3. The bandpass filter circuit according to claim 2, comprising at least one matching circuit provided between the input terminal and the first node and/or between the output terminal and the second node.

4. The bandpass filter circuit according to claim 2, wherein an anti-resonant frequency of the elastic wave resonator is higher than a passband upper end of the bandpass filter circuit.

5. The bandpass filter circuit according to claim 2, comprising at least one inductor provided between the first node and the ground terminal, and/or between the second node and the ground terminal.

6. The bandpass filter circuit according to claim 1, wherein an anti-resonant frequency of the elastic wave resonator is higher than a passband upper end of the bandpass filter circuit.

7. The bandpass filter circuit according to claim 6, comprising at least one matching circuit provided between the input terminal and the first node and/or between the output terminal and the second node.

8. The bandpass filter circuit according to claim 6, comprising at least one inductor provided between the first node and the ground terminal, and/or between the second node and the ground terminal.

9. The bandpass filter circuit according to claim 1, comprising at least one inductor provided between the first node and the ground terminal, and/or between the second node and the ground terminal.

10. The bandpass filter circuit according to claim 1, comprising at least one matching circuit provided between the input terminal and the first node and/or between the output terminal and the second node.

11. The bandpass filter circuit according to claim 10, comprising at least one inductor provided between the first node and the ground terminal, and/or between the second node and the ground terminal.

12. The bandpass filter circuit according to claim 1, wherein the elastic wave resonator includes an Interdigital Transducer.

13. The bandpass filter circuit according to claim 1, wherein the elastic wave resonator includes a piezoelectric thin film resonator.

14. A module comprising the bandpass filter circuit according to claim 1.

* * * * *